(12) United States Patent
White et al.

(10) Patent No.: US 11,777,462 B2
(45) Date of Patent: *Oct. 3, 2023

(54) AMPLIFIER FREQUENCY MATCHING FOR QUBIT READOUT

(71) Applicant: Google LLC, Mountain View, CA (US)

(72) Inventors: Theodore Charles White, Santa Barbara, CA (US); Julian Shaw Kelly, Santa Barbara, CA (US)

(73) Assignee: Google LLC, Mountain View, CA (US)

(*) Notice: Subject to any disclaimer, the term of this patent is extended or adjusted under 35 U.S.C. 154(b) by 305 days.

This patent is subject to a terminal disclaimer.

(21) Appl. No.: 17/124,360

(22) Filed: Dec. 16, 2020

(65) Prior Publication Data

US 2022/0052662 A1 Feb. 17, 2022

Related U.S. Application Data

(63) Continuation of application No. 16/333,122, filed as application No. PCT/US2016/051933 on Sep. 15, 2016, now Pat. No. 10,903,809.

(51) Int. Cl.
| | |
|---|---|
| *H03F 19/00* | (2006.01) |
| *G06N 10/00* | (2022.01) |
| *H03H 11/04* | (2006.01) |
| *H03K 19/195* | (2006.01) |

(52) U.S. Cl.
CPC ............ *H03F 19/00* (2013.01); *G06N 10/00* (2019.01); *H03H 11/04* (2013.01); *H03K 19/1954* (2013.01)

(58) Field of Classification Search
CPC ........ H03F 19/00; G06N 10/00; H03H 11/04; H03K 19/1954

USPC ................................................ 333/4; 330/4.6
See application file for complete search history.

(56) References Cited

U.S. PATENT DOCUMENTS

| 9,589,236 B1* | 3/2017 | Abdo ..................... G06N 20/00 |
| 10,903,809 B2* | 1/2021 | White ................. H03K 19/1954 |
| 2003/0207766 A1 | 11/2003 | Esteve et al. |
| 2005/0001209 A1 | 1/2005 | Hilton et al. |
| 2013/0009677 A1 | 1/2013 | Naaman et al. |
| 2016/0112031 A1 | 4/2016 | Abraham et al. |

(Continued)

FOREIGN PATENT DOCUMENTS

| CN | 1320304 | 10/2001 |
| CN | 205105232 | 3/2016 |

(Continued)

OTHER PUBLICATIONS

Abdo et al., "Josephson directional amplifier for quantum measurement of superconducting circuits", published on arXiv: 1311,5345v1, Nov. 21, 2013. (Year: 2013).*

(Continued)

*Primary Examiner* — Hafizur Rahman
(74) *Attorney, Agent, or Firm* — Fish & Richardson P.C.

(57) ABSTRACT

A quantum computing devices includes: a qubit; a readout device coupled to the qubit, the readout device including a frequency filter having a filter frequency range; and an amplifier device coupled to the readout device, in which the amplifier device is configured to amplify a measurement signal from the readout device upon receiving a pump signal having a pump frequency that is outside of the filter frequency range of the frequency filter.

36 Claims, 6 Drawing Sheets

(56) References Cited

U.S. PATENT DOCUMENTS

2016/0191060 A1   6/2016   McDermott, III et al.
2016/0267032 A1*  9/2016   Rigetti ................ G06F 13/4068

FOREIGN PATENT DOCUMENTS

| JP | S53104146 | 9/1978 |
| JP | 2005-524980 | 8/2005 |
| JP | 2009-225213 | 10/2009 |
| JP | 2012-064622 | 3/2012 |
| JP | 2014-523705 | 9/2014 |
| WO | WO 2015/057839 | 4/2015 |
| WO | WO 2018/052427 | 3/2018 |

OTHER PUBLICATIONS

Decision to Grant a Patent in Japanese Appln. No. 2019-514298, dated Aug. 2, 2021, 5 pages (with English translation).
JP Office Action in Japanese Appln. No. 2019-514298, dated Feb. 8, 2021, 6 pages (with English translation).
Abdo et al., "Josephson directional amplifier for quantum measurement of superconducting circuits," https://arxiv.org/abs/1311.5345, Nov. 2013, 14 pages.
AU Notice of Acceptance in Australian Patent Application No. 2016423167, dated Sep. 26, 2019, 3 pages.
CA Office Action in Canadian Appln. No. 3,036,059, dated Apr. 9, 2020, 4 pages.
JP Notice of Reasons for Rejection in Japanese Appln. No. 2019-514298, dated Jan. 27, 2020, 11 pages.
JP Office Action in Japanese Appln. No. 2019-514298, dated Sep. 23, 2020, 10 pages (with English translation).
PCT International Preliminary Report on Patentability Chapter II in International Application No. PCT/US2016/051933, dated Sep. 9, 2016, 16 pages.
PCT International Search Report and Written Opinion in International Application No. PCT/US2016/051933, dated Jun. 2, 2017, 28 pages.
Sank et al, "Fast Scalable State Measurement with Superconducting Qubits," arXiv, Jan. 2014, 9 pages.
White et al., "Traveling wave parametric amplifier with Josephson junctions using minimal resonator phase matching," Applied Physics Letters, 2015, 106:242601-1-242601-5.
Office Action in Chinese Appln. No. 201680089280.5, dated Oct. 26, 2022, 13 pages (with English translation).

* cited by examiner

AMPLIFIER FREQUENCY MATCHING FOR QUBIT READOUT

CROSS-REFERENCE TO RELATED APPLICATIONS

This application is a Continuation Application of U.S. Ser. No. 16/333,122, filed Mar. 13, 2019, which is a National Stage Application under 35 U.S.C. § 371 and claims the benefit of International Application No. PCT/US2016/051933, filed Sep. 15, 2016. The disclosure of the foregoing applications are hereby incorporated by reference in their entirety.

TECHNICAL FIELD

The present disclosure relates to amplifier frequency matching for qubit readout.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

Quantum annealing, also known as adiabatic quantum computing, is an approach to quantum computing in which a computational problem is encoded in interactions among multiple qubits. The encoded computational problem is referred to as the problem Hamiltonian $H_p$. The collection of encoded qubits is slowly annealed to the lowest energy configuration of a final Hamiltonian $H_f$ representative of a solution to the encoded problem. This model can sometimes be referred to as the adiabatic model of quantum computation.

SUMMARY

The present disclosure relates to amplifier frequency matching for qubit readout. In general, in some aspects, the present disclosure covers protecting a qubit and measurement resonator from reflected amplifier pump signals by including a frequency filter in an output signal line between the measurement resonator and the amplifier, and by modifying the pump tone frequency so the frequency of the reflected signal falls outside of a filter frequency range of the filter.

In general, in some aspects, the subject matter of the present disclosure may be embodied in quantum computing devices that include: a qubit; a readout device coupled to the qubit, the readout device including a frequency filter having a filter frequency range; and an amplifier device coupled to the readout device, in which the amplifier device may be configured to amplify a measurement signal from the readout device upon receiving a pump signal having a pump frequency that is outside of the filter frequency range of the frequency filter.

Implementations of the quantum computing devices may include one or more of the following features. For example, in some implementations, the pump frequency may be above an upper cutoff frequency of the frequency filter or below a lower cutoff frequency of the frequency filter by at least about 10 MHz.

In some implementations, the pump frequency may be above an upper cutoff frequency of the frequency filter or below a lower cutoff frequency of the frequency filter by at least about 100 MHz.

In some implementations, the frequency filter may be operable to attenuate signals at the pump frequency by at least 3 dB. The frequency filter may be operable to attenuate signals at the pump frequency by at least 10 dB.

In some implementations, the amplifier device includes a traveling wave parametric amplifier (TWPA). The TWPA may include a Josephson junction TWPA. The TWPA may include a kinetic inductance TWPA.

In some implementations, the readout device includes a measurement resonator. The filter frequency range of the frequency filter may overlap an operating frequency of the measurement resonator. An operating frequency of the qubit may be outside of the filter frequency range of the frequency filter. Each of the qubit and the frequency filter may be coupled to a common node of the measurement resonator. The measurement resonator may include a first co-planar waveguide resonator and the frequency filter may include a second co-planar waveguide resonator. The second co-planar waveguide resonator may include a half-wave ($\lambda/2$) or a quarter wave ($\lambda/4$) coplanar waveguide resonator.

In some implementations, the quantum device further includes a substrate, in which the qubit device, the readout device and the amplifier device are integrated on the substrate.

In some implementations, the quantum device further includes a pump frequency generator coupled to the amplifier device and operable to provide the pump signal to the amplifier device.

In some implementations, the frequency filter includes a bandpass filter, a low pass filter, or a high pass filter.

In general, in some other aspects, the subject matter of the present disclosure may be embodied in methods of measuring a state of a qubit, in which the methods include: applying a probe signal to a readout device that may be coupled to the qubit to produce, from the readout device, a measurement signal indicative of the state of the qubit, in which the readout device comprises a frequency filter having a filter frequency range; transmitting a pump signal to an amplifier device arranged to receive the measurement signal from the readout device, such that the amplifier device amplifies the measurement signal, in which the pump signal has a pump frequency that is outside of the filter frequency range; and detecting the amplified measurement signal.

Implementations of the methods may include one or more of the following features. For example, in some implementations, the pump frequency may be above an upper cutoff frequency of the frequency filter or below a lower cutoff frequency of the frequency filter by at least about 10 MHz.

In some implementations, the pump frequency may be above an upper cutoff frequency of the frequency filter or below a lower cutoff frequency of the frequency filter by at least about 100 MHz.

In some implementations, the frequency filter attenuates signals at the pump frequency by at least about 3 dB. The frequency filter may attenuate signals at the pump frequency by at least about 10 dB.

In some implementations, the filter frequency range overlaps a frequency of the measurement signal.

In some implementations, an operating frequency of the qubit may be outside of the filter frequency range.

In some implementations, a bandwidth of the filter frequency range may be about 200 MHz.

In some implementations, the frequency filter attenuates a reflected pump signal from the amplifier device.

In some implementations, the frequency filter includes a bandpass filter, a low pass filter, or a high pass filter.

In general, in another aspect, the subject matter of the present disclosure may be embodied in quantum computing devices that include: a qubit; a readout device coupled to the qubit, the readout device including a frequency filter having a filter frequency range; and an amplifier device coupled to the readout device, in which the frequency filter is configured to attenuate signals reflected from the amplifier device toward the frequency filter, the reflected signals having frequencies that are outside of the filter frequency range.

Implementations may include one or more of the following advantages. For example, in some implementations, by selecting the pump signal of the amplifier to operate at a frequency that is outside of the passband of the frequency filter, the filter may effectively protect a qubit from a reflected pump tone. In some implementations, the bandwidth of the amplifier may be large enough that the amplifier may still amplify signals away from the pump tone including the signals obtained from the measurement readout devices.

For the purposes of this disclosure, a superconductor (alternatively, superconducting) material may be understood as a material that exhibits superconducting properties at or below a superconducting critical temperature.

Examples of superconductor material include, but are not limited to, aluminum (superconducting critical temperature of, e.g., 1.2 kelvin), niobium (superconducting critical temperature of, e.g., 9.3 kelvin) and titanium nitride (superconducting critical temperature of, e.g., 5.6 kelvin).

The details of one or more implementations are set forth in the accompanying drawings and the description below. Other features and advantages will be apparent from the description, the drawings, and the claims.

DETAILED DESCRIPTION

Readout of a superconductor qubit may be accomplished using the dispersive interaction between a superconductor qubit and a superconductor readout device (e.g., a measurement resonator). For example, a probe tone may be generated and samples the frequency of the superconductor measurement readout device to measure a phase shift that depends on the state/frequency of the superconductor qubit. However, in some cases, the signal obtained from the measurement readout device may be attenuated over the output line, decreasing the signal to noise ratio and making measurement more difficult. To improve the signal to noise ratio, an amplifier may be placed at the output of the measurement readout device. An example of an amplifier that may be used to enhance the output signal is the traveling wave parametric amplifier (TWPA). A TWPA provides relatively high bandwidth, dynamic range and saturation power, thus potentially permitting frequency multiplexing and therefore improvements in the scaling of superconductor quantum processors.

Figure 1:
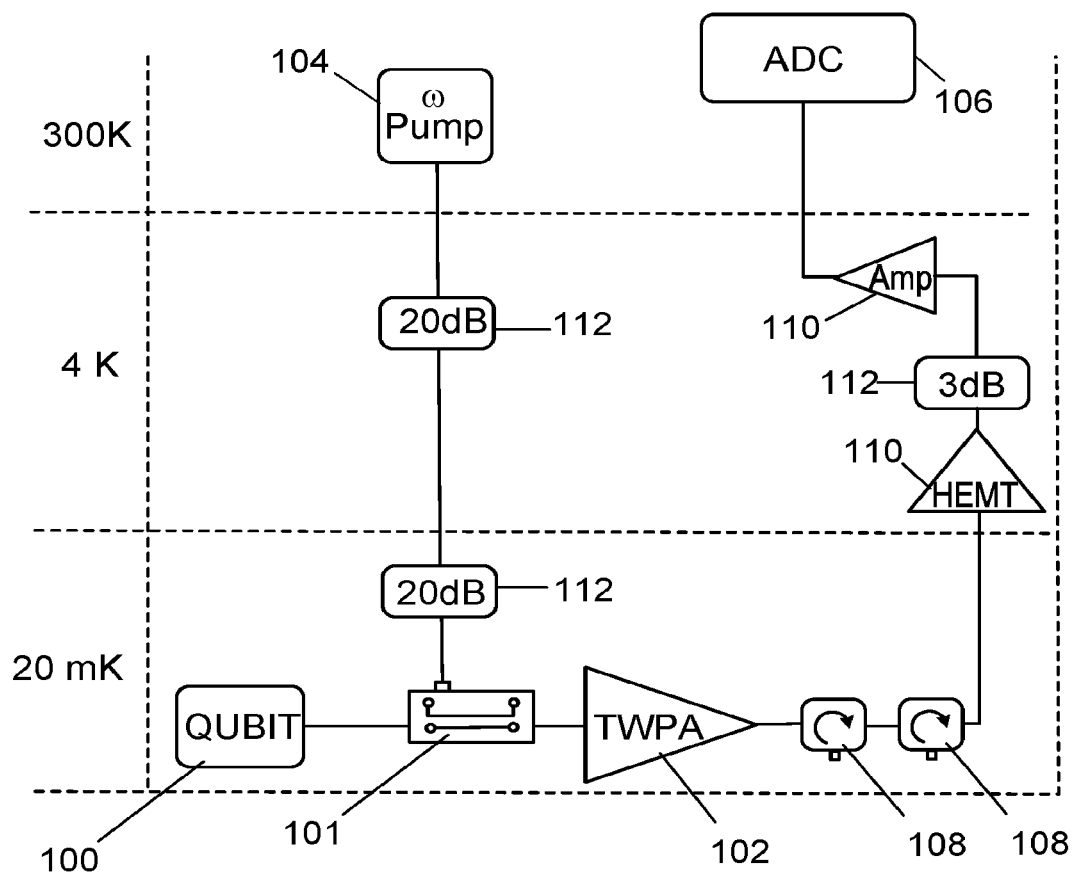
FIG. 1 is a circuit schematic illustrating an example of a qubit coupled to a traveling wave parametric amplifier.

FIG. 1 is a circuit schematic illustrating an example of a qubit/measurement resonator 100 coupled to a TWPA 102. When performing a readout measurement, a pump tone may be generated by a signal generator 104 and inductively coupled at coupler 101 to a signal line between the qubit/measurement resonator 100 and the amplifier 102. The coupler 101, may include, for example, a separate microwave component known as a directional coupler that couples the pump tone into the signal path, so that not much signal is lost to the pump line.

Element 100 in FIG. 1 represents both the qubit and measurement resonator. After receiving the pump tone, and the output signal from the measurement resonator, the amplifier 102 amplifies the output signal and provides the amplified output signal to an analog-to-digital converter (ADC) 106. Circulators 108 protect the amplifier 102 from noise passing through the output line in reverse. Additional amplifiers 110 including for example, a high-electron mobility amplifier (HEMT), may be used to further increase the signal-to-noise ratio. Line loss/line attenuation is indicated by elements 112. The circuit illustrated in FIG. 1 is divided by dashed lines into separate regions to identify the temperature range in which the different components operate. For example, the signal generator 104 and the ADC 106 are operated at room temperature (e.g., approximately 300 K), the amplifiers 110 are operated at approximately 4 K, and the superconductor qubit/measurement resonator 100, TWPA 102 and circulators 108 are operated at approximately 20 mK. Cooling to such low temperatures allows superconductor material to exhibit superconducting properties, as well as reduces thermal fluctuations that may lead to decoherence.

Figure 2:
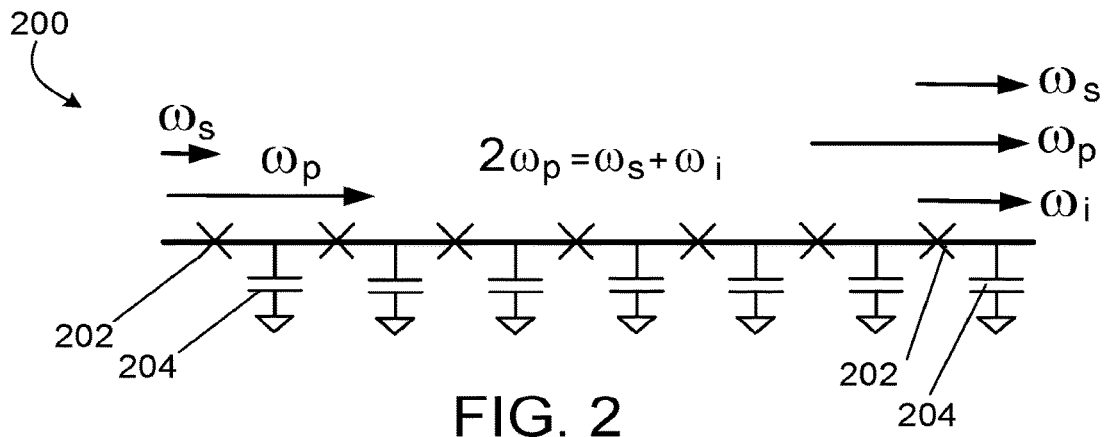
FIG. 2 is a circuit diagram that illustrates an example of a traveling wave parametric amplifier (TWPA).

FIG. 2 is a circuit diagram that illustrates an example of a TWPA 200, in particular a Josephson junction TWPA. Other TWPAs, such as kinetic inductance TWPAs (which rely on current dependent inductance of superconductors), may be used instead. Each cross 202 corresponds to a Josephson junction. As shown in FIG. 2, the TWPA 200 combines Josephson junctions 202 with shunt capacitors 204 coupled to ground to construct a superconducting lumped element transmission line having a predetermined impedance (e.g., 50 ohms). The pump tone $\omega_p$ modulates the current dependent inductance of the TWPA 200 so as to couple the pump tone $\omega p$ to the signal $\omega s$ from the measurement resonator and an idler tone $\omega_i$ via frequency mixing such that $\omega_s + \omega_i = 2\omega_p$. The idler tone may be generated by the amplifier 200 to conserve energy during the amplification process. The electrically conducting elements of the TWPA (e.g., the electrodes of the capacitors) are formed from a superconductor material, such as aluminum, niobium, or titanium nitride, among others, whereas. The dielectric of the capacitors and Josephson junctions may include, e.g., aluminum oxide (e.g., $Al_2O_3$ or amorphous silicon). The superconductor TWPA may be fabricated using the same or similar processing techniques as employed for integrated circuit fabrication (e.g. photolithography, material deposition such as sputtering or chemical vapor deposition, and material removal such as etching or lift-off). Gain, bandwidth, and dynamic range of the TWPA may be determined by the coupled mode equations of a nonlinear transmission line. Further details on the operation and fabrication of a TWPA can be found in "Traveling wave parametric amplifier with Josephson junctions using minimal resonator phase matching," T. C. White, et al., Applied Physics Letters, Vol. 106, 242601-1 to 242601-5 (2015), which is incorporated herein by reference in its entirety.

Figure 3:
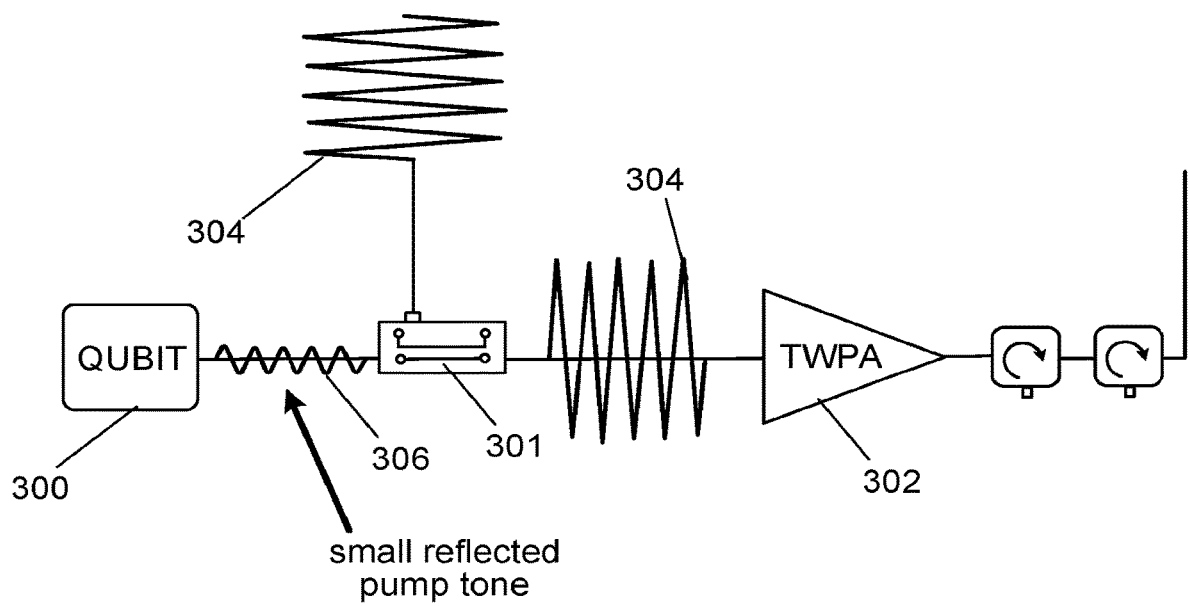
FIG. 3 is a circuit schematic that illustrates an example of a qubit/measurement resonator that is coupled to a TWPA.

When the pump tone for the TWPA is injected into the signal line using the coupler (e.g., coupler 101 shown in FIG. 1), internal reflections from the TWPA may arise. FIG. 3 is a circuit schematic that illustrates an example of a qubit/measurement resonator 300 that is coupled to a TWPA 302. As shown in FIG. 3, a pump signal 304 may be inductively coupled to the TWPA 302 at coupler 301. The pump signal may be understood as a driving voltage or current for driving the amplifier operation. The pump signal 304 then passes to TWPA 302. A reflected and attenuated signal 306 from TWPA 302, however, radiates backwards towards the qubit/measurement resonator 300. Because the reflected pump tone signal 306 propagates at a frequency similar to the frequency of the readout resonator, the reflected pump tone signal 306 can interfere with the qubit and substantially degrade the qubit performance. For example, the reflected signal 306 may cause photons to be added to the qubit and/or generate quasi-particles, leading to decoherence. While circulators may be positioned between the TWPA 302 and the qubit/measurement resonator 300 to block the reflected signal 306, the circulators tend to further degrade the measurement signal, which, as explained herein, is already attenuated by the output signal line. This further degradation may limit readout fidelity. Furthermore, circulators tend to be bulky, expensive and emit electromagnetic fields that may interfere with signals propagating on the superconductors.

The qubit/measurement resonator may be protected from reflected amplifier pump tones by including a frequency filter (e.g., a bandpass filter, a high pass filter, a low pass filter, or a stepped impedance filter, among others) in the output signal line between the measurement resonator and the amplifier, and by modifying the pump tone frequency so the pump tone frequency falls outside of a filter frequency range of the filter. In this way, the reflected pump signal may be attenuated by the frequency filter and cannot reach the qubit to cause decoherence. Furthermore, frequency filters may be less complex and costly to fabricate relative to circulators, and do not emit electromagnetic fields that interfere with other signals propagating on the superconducting lines of the system.

Figure 4:
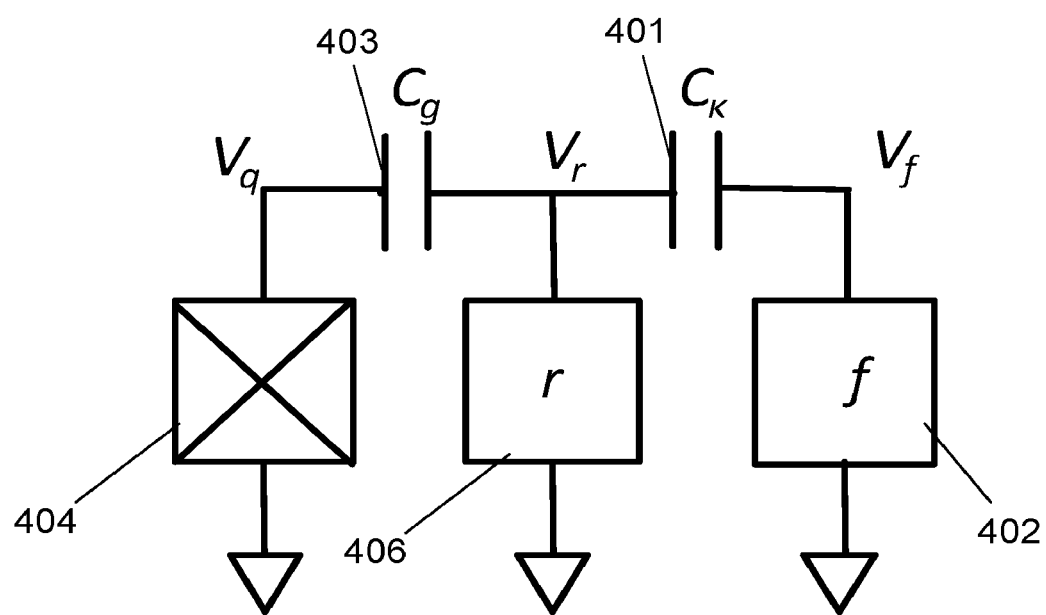
FIG. 4 is a lumped element circuit schematic illustrating an example arrangement of a frequency filter coupled to a qubit and to a measurement resonator.

The frequency filter may include a filter such as, e.g., a Purcell bandpass filter. Generally, a Purcell filter impedes the propagation of a photon emitted from the qubit at the qubit frequency, compared with the propagation of a microwave field at the measurement resonator frequency, and thus prevents energy leakage of a qubit through unwanted decay channels. The bandpass filter may be implemented as, e.g., a quarter-wave ($\lambda/4$) or half-wave ($\lambda/2$) coplanar waveguide resonator coupled across the measurement readout resonator, though other resonator designs are also possible. FIG. 4 is a lumped element schematic illustrating an example arrangement of a bandpass filter 402 with a qubit 404 and measurement resonator 406. The qubit's measurement resonator 406 may be coupled in parallel to the filter 402 through a capacitance $C_k$ (401) and the qubit may be connected to the resonator 406 by a capacitance $C_g$ (403). Alternatively, the coupling between the filter and qubit and resonator may be inductive. The voltages across the qubit 404, resonator 406 and filter 402 are $V_q$, $V_r$, and $V_f$, respectively. Though a single qubit and single measurement resonator are coupled to the filter 402 in FIG. 4, multiple qubits and resonators may be coupled to the filter, provided the bandwidth of the filter is large enough to accommodate the different measurement resonator frequencies.

Figure 5:
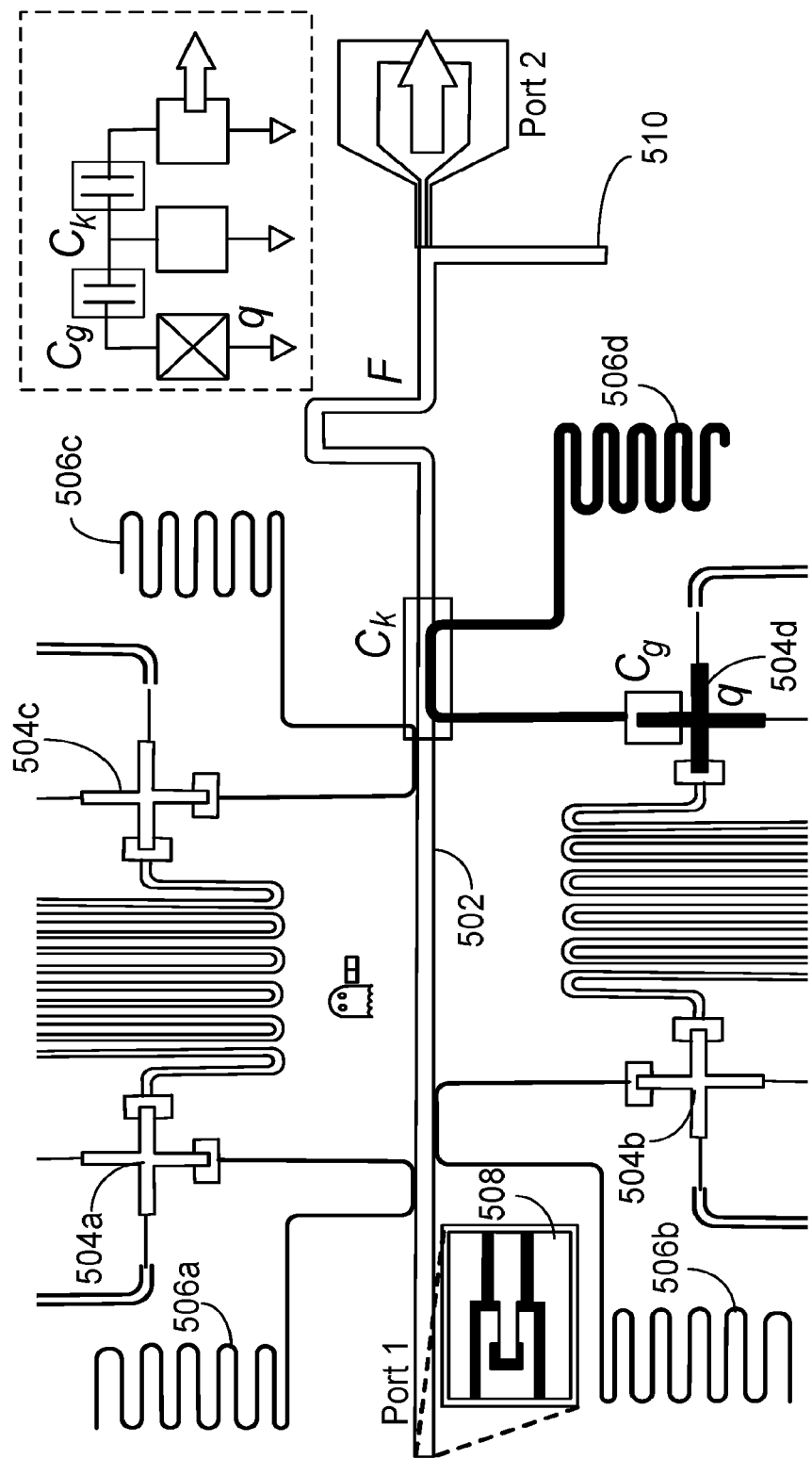
FIG. 5 is a schematic illustrating an example implementation of a frequency filter coupled to multiple qubits and resonators.

FIG. 5 is a schematic illustrating an example implementation of a bandpass filter coupled to multiple qubits and resonators. An equivalent circuit schematic structure is shown in the inset. In the example shown in FIG. 5, four superconductor transmon qubits (504a, 504b, 504c, 504d) and their corresponding measurement resonators (506a, 506b, 506c, 506d) are coupled to a single bandpass filter 502, in which the bandpass filter 502 is a Purcell filter. The Purcell filter 502 may be implemented as a quarter-wave ($\lambda/4$) coplanar waveguide resonator. However, other implementations may be used instead including, e.g., a half-wave ($\lambda/2$) coplanar waveguide or a lumped geometry waveguide. The superconductor qubits 504, resonators 506 and filter 502 are fabricated using the same or similar processing techniques as employed for integrated circuit fabrication (e.g. photolithography, material deposition such as sputtering or chemical vapor deposition, and material removal such as etching or lift-off). A capacitor formed at a first end 508 of the filter 502 (enlarged view shown in inset on left) establishes a voltage antinode, while a ground connection 510 at a distance $\lambda/4$ imposes a voltage node. The qubits 504 may be capacitively coupled to the filter 502 with a capacitance $C_k$, or inductively coupled to the filter 502. The Purcell filter 502 may be designed so that the measurement resonator frequencies, but not the qubit frequencies, are within the pass band of the filter. The center frequency of the passband of the filter 502 may be expressed as $f=c/\lambda$, where c is the speed of light in the medium and $\lambda$ is four times the length of the co-planar waveguide. The speed c may be determined from the inductance and capacitance per unit length. The range of frequencies passed by the passband filter may be determined according to the coupling strength of external lines coupled to the bandpass filter structure. The frequency filter is not limited to the design shown in FIG. 5 and other frequency filter designs may be used instead.

Figure 6:
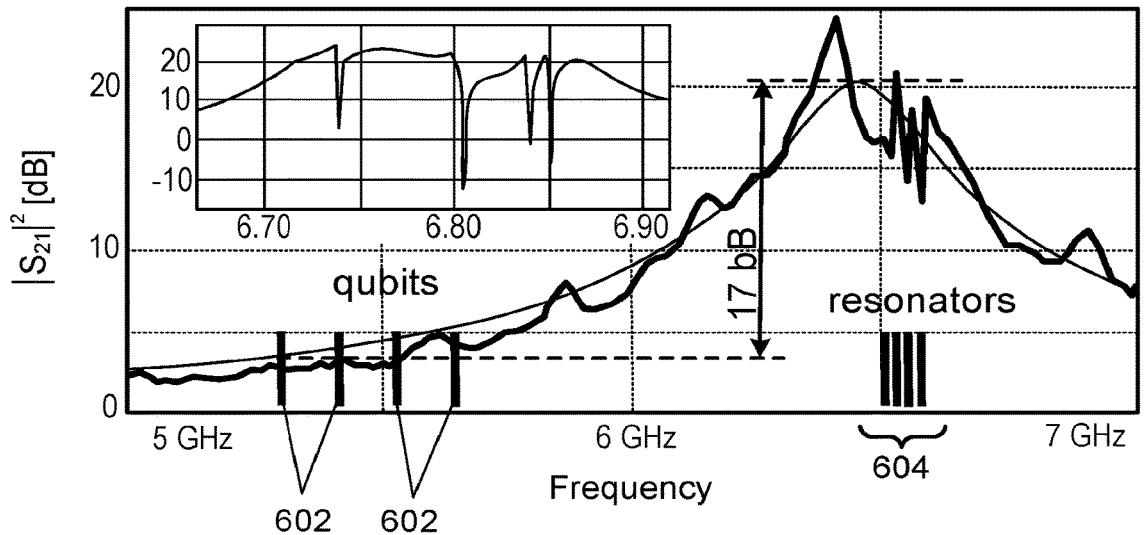
FIG. 6 is a plot of an example transmission spectrum $S_{21}$ of the device layout shown in FIG. 5.

FIG. 6 is a plot of an example transmission spectrum $S_{21}$ of the device layout shown in FIG. 5. As shown in FIG. 6, the qubit frequencies 602 are off resonance and outside of the pass band of the filter, whereas the resonator frequencies 604 are within the pass band of the filter. Further information on the operation and fabrication of Purcell filters may be found in "Fast Accurate State Measurement with Superconducting Qubits," Jeffrey et al., Phys. Rev. Lett. Vol. 112, 190504-1 to 190504-5 (2014), which is incorporated herein by reference in its entirety.

Figure 7:
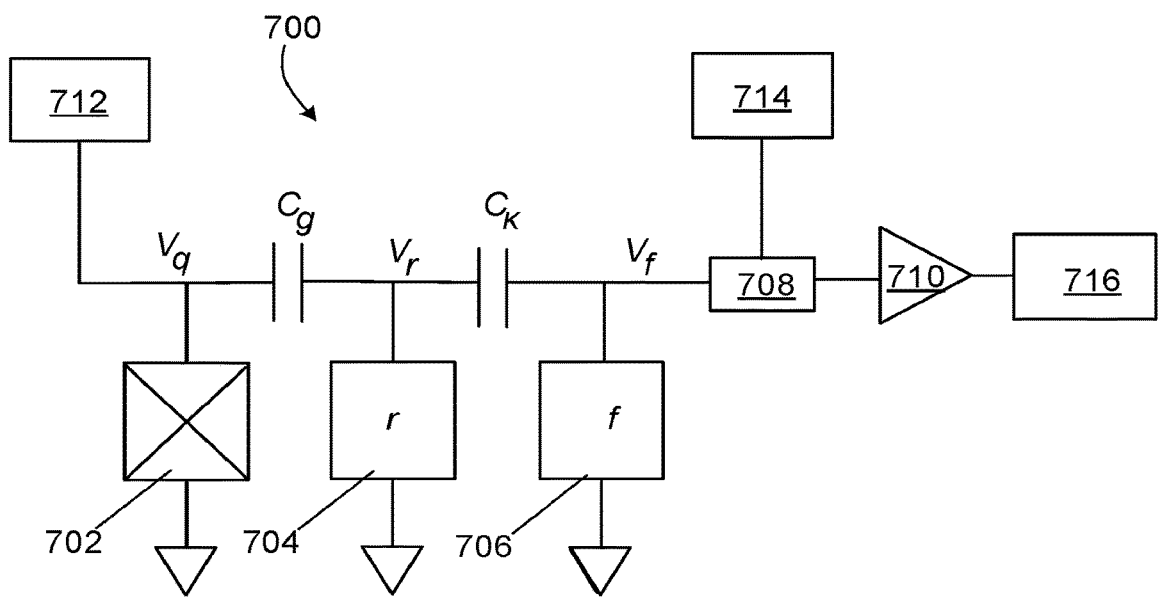
FIG. 7 is a schematic that illustrates an example circuit that includes both a frequency filter and a TWPA amplifier.

FIG. 7 is a schematic that illustrates an example circuit 700 that includes both a frequency filter and a TWPA amplifier. In particular, circuit 700 includes a qubit 702, a measurement readout resonator 704, a bandpass filter 706 (e.g., a Purcell filter), a coupler 708 and a TWPA 710 (e.g., a Josephson junction TWPA). The circuit 700 further includes a first waveform generator 712 for providing the measurement probe signal to the measurement resonator 704 and a second waveform generator 714 for providing the pump signal to the TWPA 710. The output from the TWPA may be coupled to an ADC 716. Additional circuit elements, such as circulators and other amplifiers downstream of the TWPA 710, are omitted from FIG. 7 for clarity. Each of the qubit and the filter 706 may be capacitively coupled to a common node of the measurement resonator 704. Alternative methods for coupling may be used instead including, e.g., inductive coupling.

Though circuit 700 is shown to include only a single qubit 702 and measurement resonator 704 coupled to filter 706, multiple qubits and corresponding measurement resonators may be coupled to filter 706. The qubit 702 may include a superconducting qubit, such as a transmon qubit, an x-mon qubit, or a flux-mon qubit. Other superconducting qubits may be used as well. The resonator 704 includes, e.g., a co-planar waveguide resonator formed from a superconductor material. The filter 706 and TWPA 710 also may be constructed from superconductor materials and dielectrics (e.g., aluminum oxide and/or amorphous silicon) as explained herein. Each of the qubit 702, the measurement resonator 704, the filter 706, the coupler 708 and the TWPA 710 may be formed on/integrated on the same chip, such as the same silicon or sapphire substrate or wafer, and are operated at temperatures below the critical temperature of the superconducting material from which they are formed.

During operation of the circuit 700, the first signal generator 712 provides the probe signal to the measurement resonator 704 to probe the state-dependent frequency shift of the resonator 704. The response of the resonator 704 may be coupled to filter 706 and then passes to TWPA 710. At the same time the resonator signal is passed to TWPA 710, a pump signal from second waveform generator 714 may be coupled, through coupler 708, to TWPA 710. The resonator output signal then may be amplified by TWPA 710 and passed to ADC 716, where the digitized signal is digitally processed so that the state-dependent phase shift of the resonator 704 can be extracted, e.g., by an electronic processor. To avoid amplifier pump reflections from interfering with the qubit 702, the TWPA 710 may be operated using a pump signal frequency that is outside of the pass band range of the filter 706. By operating the TWPA 710 with a pump signal having a frequency outside of the passband range of filter 706, the filter 706 may effectively protect the qubit 702 from decoherence caused by the pump tone. This is possible because the bandwidth of the TWPA 710 is large enough that it may still amplify measurement signals far away from the pump tone. In some implementations, there are non-idealities in a superconducting TWPA 710 that prevent maximum gain from being achieved. The non-idealities may be corrected by adding geometric resonators periodically to the TWPA line, in which the added resonators correct the phase of the pump. The frequency associated with the added resonators is fixed and sets the center frequency of the TWPA 710. The TWPA 710 provides enough bandwidth that the center frequency may be set outside the passband of the bandpass filter 706, but still allows for sufficient amplification within the passband.

Figure 8:
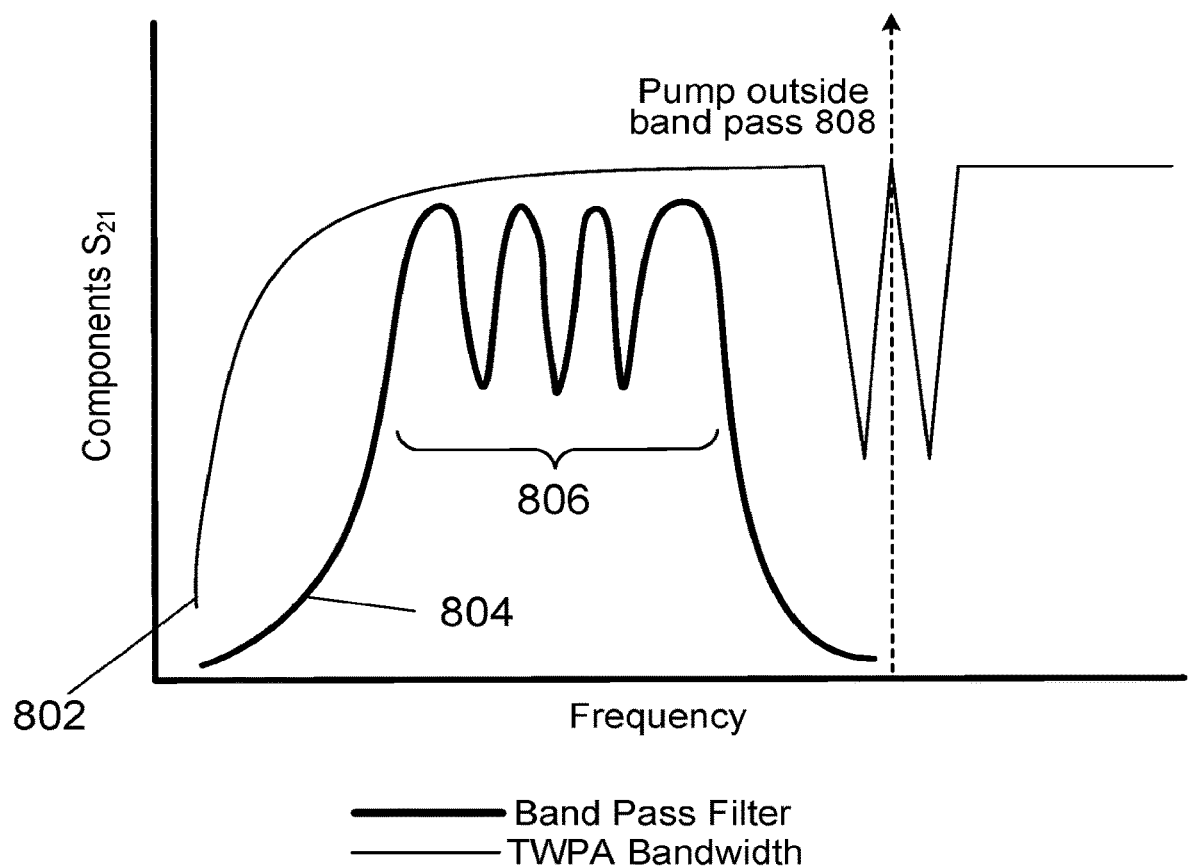
FIG. 8 is a plot that illustrates an example of a transmission spectrum for the circuit shown in FIG. 7.

FIG. 8 is a plot that illustrates an example of a transmission spectrum for the circuit 700 shown in FIG. 7. The first line 802 corresponds to the transmission spectrum of the TWPA 710 and the second line 804 corresponds to the transmission spectrum of the bandpass filter 706. As can be seen in FIG. 8, the pass band range 806 of the filter 706 overlaps and is within the range of larger transmission spectrum of the amplifier 710. Thus, measurement signals transmitted by the filter 706 will also be amplified by the TWPA 710. The operating frequency of the qubits are located outside of the pass band range 806 and are therefore blocked by the filter 706. Similarly, the pump tone frequency 808 may be located outside of the pass band range 806 of the filter 706, but still within the large bandwidth of the TWPA 710. Accordingly, the pump tone may still be used to drive the amplifier 710, but reflected pump tones having the same frequency will be attenuated by the filter 706. The notches shown in the transmission spectrum of the TWPA 710 are a result of the resonators.

The frequency 808 of the pump tone may be above an upper cutoff frequency of the frequency filter or below a lower cutoff frequency of the frequency filter. The cutoff frequency may be the frequency either above or below which the power output of the filter has fallen to a given proportion of the power in the passband. For example, the cutoff frequency may be defined as the frequency at which the power falls 3 dB (or, e.g., 10 dB) from the power in the passband. In some implementations, the pump tone may be separated from a cutoff frequency of the filter 706 by at least about 10 MHz, by at least about 50 MHz, by at least about 100 MHz, by at least about 150 MHz, by at least about 300 MHz, by at least about 500 MHz, or by at least about 1 GHz, among other distances. The filter 706 may have various different bandwidths depending, e.g., on the measurement resonator and qubit frequencies being used. As examples, in some implementations, the filter 706 may have a bandwidth of about 200 MHz, 400 MHz, 600 MHz, 800 MHz, 1 GHz, 1.2 GHz, 1.4 GHz, 1.6 GHz, 1.8 GHz or 2 GHz, among other ranges. The filter 706 may operate on signals having frequencies in the microwave range. The amplifier 710 also operates to provide gain for signals having frequencies in the microwave range and has a bandwidth that is large enough to cover the pump tone frequency 808 and passband of the filter 706. As examples, in some implementations, the TWPA 710 may have a bandwidth for providing signal gain of about 400 MHz, 600 MHz, 800 MHz, 1000 MHz, 1.2 GHz, 1.4 GHz, 1.6 GHz, 1.8 GHz, 2 GHz or 2.2 GHz, among other ranges Implementations of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements may be used to perform quantum processing operations. That is, the quantum circuit elements may be configured to make use of quantum-mechanical phenomena, such as superposition and entanglement, to perform operations on data in a non-deterministic manner. Certain quantum circuit elements, such as qubits, may be configured to represent and operate on information in more than one state simultaneously. Examples of superconducting quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. For instance, various examples are described herein using bandpass filters. However, other filters, such as low pass filters, high pass filters, stepped impedance filter, among other types of filters may be used instead. Similar to the bandpass filters described herein, the other filters may attenuate reflected pump signals while allowing signals at the measurement frequencies to pass. Other implementations are within the scope of the following claims.

What is claimed is:

1. A quantum computing device comprising:
   a qubit;
   a readout device coupled to the qubit, the readout device comprising a frequency filter having a filter frequency range, wherein the readout device comprises a measurement resonator, wherein the frequency filter is configured to attenuate transmission of signals outside of the filter frequency range; and
   an amplifier device coupled to the readout device, wherein the amplifier device is configured to amplify a measurement signal from the readout device upon receiving a pump signal having a pump frequency that is outside of the filter frequency range of the frequency filter.

2. The quantum computing device of claim 1, wherein the pump frequency is above an upper cutoff frequency of the frequency filter or below a lower cutoff frequency of the frequency filter by at least about 10 MHz.

3. The quantum computing device of claim 1, wherein the pump frequency is above an upper cutoff frequency of the frequency filter or below a lower cutoff frequency of the frequency filter by at least about 100 MHz.

4. The quantum computing device of claim 1, wherein the frequency filter is operable to attenuate signals at the pump frequency by at least 3 dB.

5. The quantum computing device of claim 4, wherein the frequency filter is operable to attenuate signals at the pump frequency by at least 10 dB.

6. The quantum computing device of claim 1, wherein the amplifier device comprises a traveling wave parametric amplifier (TWPA).

7. The quantum computing device of claim 6, wherein the TWPA comprises a Josephson junction TWPA.

8. The quantum computing device of claim 6, wherein the TWPA comprises a kinetic inductance TWPA.

9. A method of measuring a state of a qubit, the method comprising:
   applying a probe signal to a readout device that is coupled to the qubit to produce, from the readout device, a measurement signal indicative of the state of the qubit, wherein the readout device comprises a frequency filter having a filter frequency range, wherein the frequency filter attenuates transmission of signals outside of the filter frequency range, wherein a bandwidth of the filter frequency range is about 200 MHz;
   transmitting a pump signal to an amplifier device arranged to receive the measurement signal from the readout device, such that the amplifier device amplifies the measurement signal, wherein the pump signal has a pump frequency that is outside of the filter frequency range; and detecting the amplified measurement signal.

10. The quantum computing device of claim 1, wherein the filter frequency range of the frequency filter overlaps an operating frequency of the measurement resonator.

11. The quantum computing device of claim 10, wherein an operating frequency of the qubit is outside of the filter frequency range of the frequency filter.

12. The quantum computing device of claim 1, wherein each of the qubit and the frequency filter is coupled to a common node of the measurement resonator.

13. The quantum computing device of claim 1, wherein the measurement resonator comprises a first co-planar waveguide resonator and the frequency filter comprises a second co-planar waveguide resonator.

14. The quantum computing device of claim 13, wherein the second co-planar waveguide resonator comprises a half-wave ($\lambda/2$) or a quarter wave ($\lambda/4$) coplanar waveguide resonator.

15. The quantum computing device of claim 1, further comprising a substrate, wherein the qubit, the readout device and the amplifier device are integrated on the substrate.

16. The quantum computing device of claim 1, further comprising:
   a pump frequency generator coupled to the amplifier device and operable to provide the pump signal to the amplifier device.

17. The quantum computing device of claim 1, wherein the frequency filter comprises a bandpass filter.

18. The quantum computing device of claim 1, wherein the frequency filter comprises a low pass filter.

19. The quantum computing device of claim 1, wherein the frequency filter comprises a high pass filter.

20. A method of measuring a state of a qubit, the method comprising:
   applying a probe signal to a readout device that is coupled to the qubit to produce, from the readout device, a measurement signal indicative of the state of the qubit, wherein the readout device comprises a frequency filter having a filter frequency range, wherein the frequency filter attenuates transmission of signals outside of the filter frequency range, wherein an operating frequency of the qubit is outside of the filter frequency range;
   transmitting a pump signal to an amplifier device arranged to receive the measurement signal from the readout device, such that the amplifier device amplifies the measurement signal,
   wherein the pump signal has a pump frequency that is outside of the filter frequency range; and
   detecting the amplified measurement signal.

21. The method of claim 20, wherein the pump frequency is above an upper cutoff frequency of the frequency filter or below a lower cutoff frequency of the filter by at least about 10 MHz.

22. The method of claim 20, wherein the pump frequency is above an upper cutoff frequency of the filter or below a lower cutoff frequency of the frequency filter by at least about 100 MHz.

23. The method of claim 20, wherein the frequency filter attenuates signals at the pump frequency by at least about 3 dB.

24. The method of claim 23, wherein the frequency filter attenuates signals at the pump frequency by at least about 10 dB.

25. The method of claim 20, wherein the filter frequency range overlaps a frequency of the measurement signal.

26. A method of measuring a state of a qubit, the method comprising:
   applying a probe signal to a readout device that is coupled to the qubit to produce, from the readout device, a measurement signal indicative of the state of the qubit, wherein the readout device comprises a frequency filter having a filter frequency range, wherein the frequency filter attenuates transmission of signals outside of the filter frequency range, wherein the frequency filter comprises a bandpass filter or a high pass filter;
   transmitting a pump signal to an amplifier device arranged to receive the measurement signal from the readout device, such that the amplifier device amplifies the measurement signal,
   wherein the pump signal has a pump frequency that is outside of the filter frequency range; and
   detecting the amplified measurement signal.

27. The method of claim 20, wherein a bandwidth of the filter frequency range is about 200 MHz.

28. The method of claim 20, wherein the frequency filter attenuates a reflected pump signal from the amplifier device.

29. The method of claim 20, wherein the frequency filter comprises a bandpass filter.

30. The method of claim 20, wherein the frequency filter comprises a low pass filter.

31. The method of claim 20, wherein the frequency filter comprises a high pass filter.

32. A quantum computing device comprising:
   a qubit;
   a readout device coupled to the qubit, the readout device comprising a frequency filter having a filter frequency range, and the readout device comprising a measurement resonator; and
   an amplifier device coupled to the readout device, wherein the frequency filter is configured to attenuate signals reflected from the amplifier device toward the frequency filter, the reflected signals having frequencies that are outside of the filter frequency range.

33. A quantum computing device comprising:
   a qubit;
   a readout device coupled to the qubit, the readout device comprising a frequency filter having a filter frequency range, wherein the frequency filter is configured to attenuate transmission of signals outside of the filter frequency range; and
   an amplifier device coupled to the readout device, wherein the amplifier device is configured to amplify a measurement signal from the readout device upon receiving a pump signal having a pump frequency that is outside of the filter frequency range of the frequency filter, and wherein the amplifier device comprises a traveling wave parametric amplifier (TWPA).

34. A quantum computing device comprising:
   a qubit;
   a readout device coupled to the qubit, the readout device comprising a frequency filter having a filter frequency range, wherein the frequency filter is configured to attenuate transmission of signals outside of the filter frequency range;
   an amplifier device coupled to the readout device, wherein the amplifier device is configured to amplify a measurement signal from the readout device upon receiving a pump signal having a pump frequency that is outside of the filter frequency range of the frequency filter; and
   a substrate, wherein the qubit, the readout device and the amplifier device are integrated on the substrate.

35. A quantum computing device comprising:

a qubit;

a readout device coupled to the qubit, the readout device comprising a frequency filter having a filter frequency range, wherein the frequency filter is configured to attenuate transmission of signals outside of the filter frequency range, wherein the frequency filter comprises a bandpass filter or a high pass filter; and an amplifier device coupled to the readout device, wherein the amplifier device is configured to amplify a measurement signal from the readout device upon receiving a pump signal having a pump frequency that is outside of the filter frequency range of the frequency filter.

36. A method of measuring a state of a qubit, the method comprising:

applying a probe signal to a readout device that is coupled to the qubit to produce, from the readout device, a measurement signal indicative of the state of the qubit, wherein the readout device comprises a frequency filter having a filter frequency range, wherein the frequency filter attenuates transmission of signals outside of the filter frequency range, wherein the readout device comprises a measurement resonator;

transmitting a pump signal to an amplifier device arranged to receive the measurement signal from the readout device, such that the amplifier device amplifies the measurement signal, wherein the pump signal has a pump frequency that is outside of the filter frequency range; and detecting the amplified measurement signal.

* * * * *